BLOCKING OSCILLATOR CONTROLLED ELECTRONIC SWITCH

Filed May 14, 1959

INVENTOR.
DONALD A. PERREAULT
BY
F. H. Henson
ATTORNEY 3,071,701

BLOCKING OSCILLATOR CONTROLLED ELECTRONIC SWITCH

Donald A. Perreault, Liverpool, N.Y., assignor to General Dynamics Corporation, Rochester, N.Y., a corporation of Delaware Filed May 14, 1959, Ser. No. 813,193
1 Claim. (Cl. 307—88.5)

Figure 1:
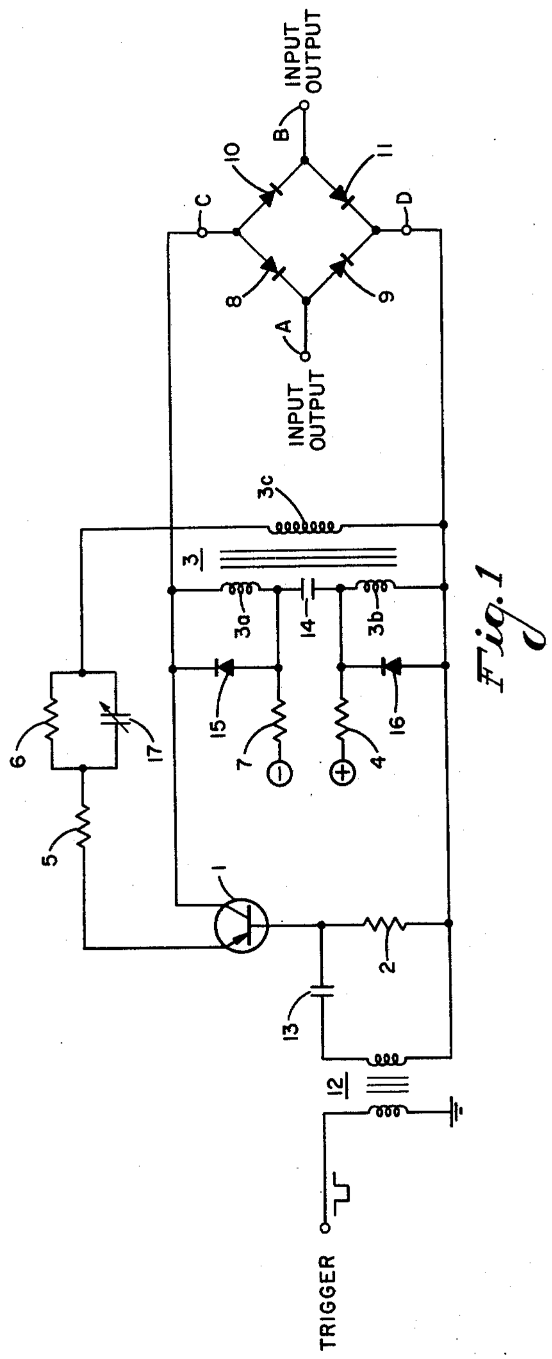

This invention relates in general to electronic switches and, more particularly, to blocking oscillator controlled electronic switches.

Electronic switches which comprise a diode bridge having the line to be opened and closed connected across one diagonal of the bridge and the control voltage for rendering the bridge diodes non-conductive and conductive applied across the second diagonal of the bridge are well known in the art. The bridge type of switch is particularly advantageous in multiplex systems where an intelligence bearing signal is to be sampled since the driving pulses, or carrier frequency signals, do not appear on the line being switched. Conventionally, the bridge diodes are normally biased in the reverse direction and are rendered conductive by a pulse applied to a transformer winding in series with the biasing potentials. In switches of the aforementioned type, a great deal of pulse power is required to overcome the reverse bias applied to the bridge diodes and this power is wasted insofar as turning the switch "On" is concerned.

Accordingly, it is the general object of this invention to provide a new and improved electronic switch.

It is a more particular object of this invention to provide a new and improved blocking oscillator controlled electronic switch which is extremely fast operating and which requires a relatively minute amount of pulse power to trigger the circuit.

The present invention accomplishes the above cited objects by providing an electronic switch of the bridge diode type which is controlled by the potentials appearing at the collector and base electrodes of a blocking oscillator transistor. That is, the diode bridge is connected in parallel with the primary winding of the transformer, which regeneratively couples the emitter of the transistor to the collector of the transistor, between the collector and base return of the transistor so that the bridge is reverse biased by the supply voltages which normally bias the transistor for non-conduction. The reverse bias is removed and the bridge diodes are forward biased when the blocking oscillator triggers because of the voltage appearing across the primary winding of the transformer.

A particular advantage of the invention is that the diode bridge forms a back clamp for the transistor which prevents the transistor from saturating and thus assures that the transistor will have a fast fall or turn off time.

Further objects and advantages of the invention will become apparent as the following description proceeds, and features of novelty which characterize the invention will be pointed out in particularity in the claim annexed to and forming a part of this specification.

For a better understanding of the invention, reference may be had to the drawing which comprises two figures on a single sheet.

FIG. 1 discloses circuit details of a blocking oscillator controlled electronic switch.

Figure 2:
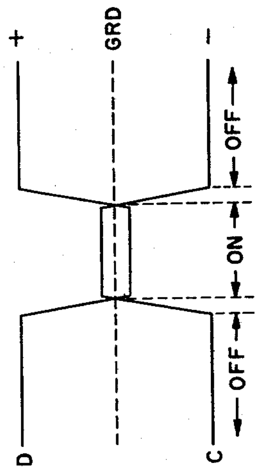

FIG. 2 illustrates the voltage waveform appearing across the control terminals of the electronic switch of FIG. 1.

In the illustrated embodiment of the invention, the base-emitter junction of P-N-P transistor 1 is normally unbiased since the base is returned to a positive potential, which may be plus twelve volts, through resistor 2, primary winding 3$b$ of transformer 3, and resistor 4, while the emitter is returned to the same positive potential through resistors 5 and 6 and secondary winding 3$c$ of transformer 3 and there is no current flowing in any of these circuit elements. Collector cutoff current, $I_{co}$, flowing in resistor 2 tends to make the base more negative than the emitter but over the normal temperature range (up to +65° C. at least) the voltage drop appearing across low value resistor 2 does not forward bias the emitter-base junction enough to cause transistor action. The base-collector junction of transistor 1 is, of course, biased in the reverse direction since the collector of transistor 1 is returned to a negative potential, which may be minus twelve volts, through primary winding 3$a$ of transformer 3 and resistor 7. Under these conditions, the electronic switch diodes 8–11 are biased in the reverse direction since the first or anode terminals of diodes 8 and 10 are connected to the collector of transistor 1, which stands at approximately minus twelve volts potential, and the second or cathode terminals of diodes 9 and 11 are connected to the lower terminal of primary winding 3$b$ of transformer 3, which terminal stands at approximately plus twelve volts potential. With the bridge diodes reverse biased, as just described, a very high impedance is presented to signals appearing on either input-output terminal A or input-output terminal B.

The blocking oscillator is triggered to its "On" condition by a pulse on the secondary of transformer 12 which momentarily drives the base negative with respect to the emitter. The pulse on the primary of transformer 12 may be either positive or negative since the relative polarity of the transformer windings may be reversed. The negative trigger pulse applied to the base of transistor 1 through capacitor 13 causes emitter current to flow in transistor 1 and thus by transistor action causes collector current to flow in transistor 1. As soon as collector current begins to flow, a voltage is induced in the secondary winding 3$c$ of transformer 3 since the collector current must flow through primary windings 3$a$ and 3$b$ of transformer 3. The induced voltage is of such a polarity as to aid the flow of current in the emitter. The voltage induced in the primary windings 3$a$ and 3$b$ of transformer 3 is of opposite polarity to the supply voltages and, due to the regenerative action just described, quickly tends to become greater in magnitude. However, as soon as the collector end of winding 3$a$ becomes more positive than the base end of winding 3$b$, the diodes 8–11 begin to conduct in the forward direction and the amount by which the collector voltage exceeds the base voltage in the positive sense (current saturation) is limited to the voltage drop across the diode bridge, as shown in FIGURE 2 "On" time, less the voltage drop across resistor 2 due to base current. As a result of this back clamping, the transistor is either completely prevented from saturating or prevented from saturating to the extent that minority carrier storage in the base of the transistor is dissipated before the end of the "On" time. This assures that the transistor will have short fall or turn off time. The forward conduction of the diodes 8–11, which is the primary objective, establishes a virtual short circuit between input-output terminal A and input-output terminal B as long as the forward control current through said diodes exceeds the magnitude of the signals to be switched.

When diodes 8–11 begin conducting, further rise of potential across the primary windings of transformer 3 is prevented, emitter regeneration is terminated, and the transistor remains in a conducting condition just short of saturation. During this "On" time, the magnetizing current in the primary windings 3$a$ and 3$b$ is increasing linearly so that a constant voltage is induced across secondary winding 3$c$ and, since this constant voltage is applied across the emitter-base connection of transistor 1, the collector current is constant. Since the control current through the bridge diodes is equal to the difference between the constant collector current and the linearly increasing transformer current, the current through the bridge diodes is linearly decreasing. Since the collector current is constant, the actual value being determined by transformer 3 turns ratio and the gain of transistor 1, the transformer primary current cannot increase linearly indefintely. As soon as the rate of increase of current begins to decline, the secondary voltage begins to fall and the circuit quickly regenerates into the "Off" condition. When the potentials of the upper terminal of primary winding 3*a* and the lower terminal of primary winding 3*b* return to minus twelve volts, and plus twelve volts, respectively, diodes 15 and 16 become conductive to prevent any further rise and the magnetizing inductance of transformer 3 is discharged through said diodes. During the off-on-off cycle, capacitor 14 bypasses resistors 4 and 7 and the actual power supply and couples the primary windings 3*a* and 3*b* together in series. It is recharged through resistors 4 and 7 during the "Off" period. Essentially, capacitor 14 is the power source during the "On" pulse period. The "On" time of the blocking oscillator is controlled by the transistor characteristics and the transformer turns ratio and primary inductance. In this gate application, the transformer turns ratio is fixed at the value which gives maximum current through diodes 8–11 (with a compromise to improve stability). Since the transformer primary inductance and the transistor parameters are subject to some variation in manufacturing, capacitor 17 is provided to adjust the pulse width in resonant transfer applications or other applications where pulse width control is critical. Capacitor 17 charges during the "On" time thus reducing the drive current available to the emitter. This, in turn, reduces the total current available from the collector so that the end of the linearly rising current in the transformer primary inductor occurs sooner, thus ending the "On" time sooner. The smaller the capacitance, the shorter the "On" time. Resistor 6 serves to discharge capacitor 17 during the "Off" time. Since any value of capacitance tends to shorten the "On" time, the transformer primary inductance is designed to make the "natural On" time of the circuit longer than required and capacitor 17 is added to obtain the approximate "On" time and then adjusted to obtain the exact "On" time.

While there has been shown and described what is at present considered to be the preferred embodiment of the invention, modifications thereto will readily occur to those skilled in the art. It is not desired, therefore, that the invention be limited to the embodiment shown and described, and it is intended to cover in the appended claim all such modifications as fall within the true spirit and scope of the invention.

What is claimed is:

An unsaturated blocking oscillator controlled electronic switch comprising first, second, third and fourth terminals, a first unidirectional conducting device connected between said first and second terminals, a second unidirectional conducting device connected between said second and third terminals, a third unidirectional conducting device connected between said first and fourth terminals, a fourth unidirectional conducting device connected between said fourth and third terminals, all of said first, second, third and fourth unidirectional conducting devices being poled to be forward biased in response to said first terminal having a first polarity potential difference with respect to said third terminal and to be reversed biased in response to said first terminal having a second polarity potential difference opposite to that of said first polarity potential difference with respect to said third terminal, a transistor having a base, a collector and an emitter, a source of bias potential difference having a given magnitude and polarity, a feedback transformer having a primary and a secondary, means for serially connecting said source and said primary between said base and said collector to reverse bias said collector with respect to said base when said transistor is not conducting, means including said secondary connected between said base and emitter to render said transistor normally non-conducting and to apply a regenerative base-emitter voltage in response to a change in collector current, means for applying a trigger pulse between said base and emitter to render said transistor conducting, whereby due to regenerative action said collector becomes forward biased with respect to said base and said collector current tends to saturate, and means providing a direct current connection between said collector and a selected one of said first and third terminals and a direct current connection between said base and the other one of said first and third terminals for applying said first polarity potential difference when said collector is forward biased with respect to said base and for applying said second polarity potential difference when said collector is reversed biased with respect to said base, whereby said first, second, third and fourth unidirectional conducting devices form a low impedance shunt between said collector and said base when said collector is forward biased with respect to said base to thereby clamp said collector to said base and prevent said collector current from being maintained at saturation.

References Cited in the file of this patent

UNITED STATES PATENTS

| | | |
|---|---|---|
| 2,639,386 | Karpeles | May 19, 1953 |
| 2,659,815 | Curtis | Nov. 17, 1953 |
| 2,745,012 | Felker | May 8, 1956 |
| 2,774,888 | Trousdale | Dec. 18, 1956 |
| 2,776,375 | Keiper | Jan. 1, 1957 |
| 2,866,909 | Trousdale | Dec. 30, 1958 |

OTHER REFERENCES

Transistor Circuit Engineering, published 1957, by John Wiley & Sons Inc., pp. 260, 349 and 350.

Chow et al.: Transistor Circuit Engineering, Wiley and Sons, 1957, p. 321 relied on.